(12) United States Patent
Hori et al.

(10) Patent No.: US 9,474,146 B2
(45) Date of Patent: Oct. 18, 2016

(54) MANUFACTURING METHOD OF RADIATOR-INTEGRATED SUBSTRATE AND RADIATOR-INTEGRATED SUBSTRATE

(71) Applicants: Nippon Light Metal Company, Ltd., Tokyo (JP); Dowa Metaltech Co., Ltd., Tokyo (JP)

(72) Inventors: Hisashi Hori, Shizuoka (JP); Takanori Kokubo, Shizuoka (JP); Hideyo Osanai, Tokyo (JP); Kunihiko Chihara, Tokyo (JP)

(73) Assignees: NIPPON LIGHT METAL COMPANY, LTD., Tokyo (JP); DOWA METALTECH CO., LTD., Tokyo (JP)

( * ) Notice: Subject to any disclaimer, the term of this patent is extended or adjusted under 35 U.S.C. 154(b) by 57 days.

(21) Appl. No.: 14/386,271
(22) PCT Filed: Mar. 13, 2013
(86) PCT No.: PCT/JP2013/057025
§ 371 (c)(1),
(2) Date: Sep. 18, 2014
(87) PCT Pub. No.: WO2013/141110
PCT Pub. Date: Sep. 26, 2013

(65) Prior Publication Data
US 2015/0041187 A1 Feb. 12, 2015

(30) Foreign Application Priority Data
Mar. 19, 2012 (JP) .................. 2012-061603

(51) Int. Cl.
H05K 1/02 (2006.01)
H05K 13/04 (2006.01)
(Continued)

(52) U.S. Cl.
CPC ............. *H05K 1/021* (2013.01); *B23K 1/0008* (2013.01); *B23K 1/0012* (2013.01);
(Continued)

(58) Field of Classification Search
CPC ...... H05K 1/021; H05K 1/05; H05K 1/0271; H05K 13/0465; B23K 1/0016; B23K 1/0012; B23K 1/19

USPC ........................... 174/252; 228/122.1
See application file for complete search history.

(56) References Cited

U.S. PATENT DOCUMENTS 7,159,310 B2 * 1/2007 Osanai ................ H01L 21/4871
257/E23.106

(Continued)

FOREIGN PATENT DOCUMENTS

JP 61247040 * 11/1986
JP 2000-335983 A 12/2000
(Continued)

OTHER PUBLICATIONS

International Search Report issued in Application No. PCT/JP2012/057025, mailed Jun. 18, 2013.
(Continued)

*Primary Examiner* — Timothy Thompson
*Assistant Examiner* — Charles Pizzuto
(74) *Attorney, Agent, or Firm* — Michael Best & Friedrich LLP (57) ABSTRACT

A metal circuit board and a metal base plate are bonded to a ceramic substrate to form a metal-ceramic bonded substrate, then the metal base plate is arranged on one surface of the radiator via a brazing material with the metal base plate overlapping with the one surface of the radiator, a jig having a concave R surface is arranged on another surface of the radiator with the jig butting against the another surface of the radiator, a jig having a convex R surface protruding toward the metal-ceramic bonded substrate is brought into contact with another surface of the metal circuit board, and the metal-ceramic bonded substrate and the radiator are heat-bonded while they are pressurized by the radiator side jig and the metal-ceramic bonded substrate side jig, wherein a curvature radius R (mm) of the convex R surface and the concave R surface is 6500≤R≤surface pressure (N/mm²)×2000+12000.

10 Claims, 5 Drawing Sheets

(51) Int. Cl.
  *B23K 1/19* (2006.01)
  *H05K 1/05* (2006.01)
  *B23K 1/00* (2006.01)
  *H01L 23/373* (2006.01)
  *H01L 21/48* (2006.01)
  *C04B 35/645* (2006.01)
  *C04B 37/02* (2006.01)
  *H01L 23/473* (2006.01)
  *H05K 1/03* (2006.01)
  *H05K 3/00* (2006.01)

(52) U.S. Cl.
  CPC .............. *B23K 1/0016* (2013.01); *B23K 1/19* (2013.01); *C04B 35/645* (2013.01); *C04B 37/021* (2013.01); *H01L 21/4882* (2013.01); *H01L 23/3735* (2013.01); *H05K 1/0271* (2013.01); *H05K 1/05* (2013.01); *H05K 13/0465* (2013.01); *C04B 2237/366* (2013.01); *C04B 2237/368* (2013.01); *C04B 2237/402* (2013.01); *C04B 2237/66* (2013.01); *C04B 2237/704* (2013.01); *H01L 23/473* (2013.01); *H01L 2924/0002* (2013.01); *H05K 1/0306* (2013.01); *H05K 3/0061* (2013.01); *H05K 2203/0278* (2013.01)

(56) References Cited

U.S. PATENT DOCUMENTS

| | | | | |
|---|---|---|---|---|
| 2005/0117302 | A1* | 6/2005 | Emoto | H01L 23/367 361/704 |
| 2010/0187680 | A1* | 7/2010 | Otsuka | H01L 23/3735 257/706 |
| 2011/0132644 | A1* | 6/2011 | Nishi | H05K 1/056 174/255 |
| 2011/0177292 | A1* | 7/2011 | Teshima | H01L 21/481 428/156 |
| 2012/0279761 | A1* | 11/2012 | Hori | H01L 21/4878 174/252 |
| 2012/0305292 | A1* | 12/2012 | Hori | H01L 23/3735 174/252 |

FOREIGN PATENT DOCUMENTS

| | | |
|---|---|---|
| JP | 2003-258167 A1 | 9/2003 |
| JP | 2008-227336 A | 9/2008 |
| JP | 2010118682 * | 5/2010 |
| JP | 2011-166127 A | 8/2011 |
| JP | 2011-210745 A | 10/2011 |
| WO | WO-2011/087027 A1 | 7/2011 |

OTHER PUBLICATIONS

Written Opinion of International Searching Authority of PCT/JP2013/057025, mailed Jun. 18, 2013.

Extended Search Report issued in European Application No. 13765162.6, dated Oct. 13, 2015.

* cited by examiner

MANUFACTURING METHOD OF RADIATOR-INTEGRATED SUBSTRATE AND RADIATOR-INTEGRATED SUBSTRATE

TECHNICAL FIELD

The present invention relates to a metal-ceramic bonded substrate and, in particular, to a manufacturing method of a radiator-integrated substrate and a radiator-integrated substrate in which a metal circuit board and a metal base plate each made of aluminum or an aluminum alloy are bonded to both surfaces of a ceramic substrate respectively and a radiator is bonded to a surface of the metal base plate where the ceramic substrate is not bonded.

This application is based upon and claims the benefit of priority of the prior Japanese Patent Application No. 2012-061603, filed in Japan on Mar. 19, 2012, the entire contents of which are incorporated herein by reference.

BACKGROUND ART

In a conventional power module used to control a large current, for example, in an electric vehicle, an electric train, a machine tool or the like, a metal-ceramic insulating substrate is fixed on one surface of a metal plate or a composite material called a base plate by soldering, and an electronic component such as a semiconductor chip is fixed on the metal-ceramic insulating substrate by soldering. Further, a heat radiation fin or a liquid-cooling jacket made of metal is attached to another surface (a rear surface) of the base plate via a heat conductive grease by screwing or the like. Patent Document 1 discusses that in the case of heat-bonding a ceramic substrate such as an aluminum nitride su+bstrate to a metal plate such as an Al plate or an Al alloy plate, a pressure of 8-100 kgf/cm$^2$ is applied in a vertical direction on the ceramic substrate.

Since soldering of the base plate, the electronic component and so on to the metal-ceramic insulating substrate is performed by heating, warpage of the base plate is likely to occur due to a difference in thermal expansion coefficient between bonded members during the soldering. Further, the heat generated from the electronic component and so on is released to air, cooling water or the like by the heat radiation fin or the cooling jacket (radiator) via the metal-ceramic insulating substrate, the solder and the base plate, so that when warpage occurs in the base plate, the clearance when attaching the heat radiation fin or the cooling jacket to the base plate increases, thus extremely decreasing the heat radiation property.

Hence, for example, Patent Document 2 discloses a manufacturing method of a liquid-cooled integrated substrate and a liquid-cooled integrated substrate in which boding of a metal circuit board and a metal base plate to a ceramic substrate is performed by a molten metal bonding method and boding of the metal base plate and a radiator is performed by a braze-bonding method, and heat-bonding of them is performed in a state of pressurization at a predetermined surface pressure obtained by an expression decided according to a second moment of area of the radiator to reduce warpage (shape distortion) as the liquid-cooled integrated substrate and thereby has excellent strength and heat radiation performance.

Further, Patent Document 3 discloses that warpage with temperature change is prevented by directly bonding a metal layer having an average grain diameter of its crystal grain of 0.5 μm or less and a ceramic substrate with their surfaces in an active state.

PRIOR ART DOCUMENT

Patent Document

[Patent Document 1] Japanese Patent Application Laid-open No. 2000-335983
[Patent Document 2] Japanese Patent Application Laid-open No. 2011-166127
[Patent Document 3] Japanese Patent Application Laid-open No. 2011-210745

DISCLOSURE OF THE INVENTION

Problems to be Solved by the Invention

However, in the manufacturing method of a liquid-cooled integrated substrate disclosed in Patent Document 2, it has been known that the suppression of warpage is insufficient when the size of the metal-ceramic bonded substrate braze-bonded to the radiator is large, which has not been improved even with a high surface pressure at bonding. Further, it has been found that making the surface pressure too high deforms a partition plate of the radiator composed of a porous pipe, failing to achieve sufficient heat radiation in some cases.

It has also been found that when the warpage of a front surface of the metal circuit board of the metal-ceramic bonded substrate is large, in particular, when a warpage amount per unit length exceeds 2 μm/mm, variation occurs in some cases in the thickness of the solder when a semiconductor chip is soldered to the metal circuit board. Occurrence of variation in thickness of the solder is not desirable for the radiator-integrated substrate because of occurrence of variation in thermal resistance.

Further, the manufacturing method discussed in Patent Document 3, in which the surfaces of the ceramic substrate and aluminum are etched with ion beams in a vacuum chamber to be subjected to activation, and then the activated surfaces of the ceramic substrate and aluminum are superposed and thereby bonded together at room temperature, is poor in mass production because of necessity of vacuum and may increase in production cost.

Hence, in consideration of the above problems, an object of the present invention is to provide a manufacturing method of a radiator-integrated substrate and a radiator-integrated substrate in which a raw material cost and a processing cost are suppressed and warpage (shape distortion) as an integrated substrate is reduced and which has excellent strength and heat radiation property.

Means for Solving the Problems

To achieve the above object, the present invention is a manufacturing method of a radiator-integrated substrate in which one surface of a metal circuit board made of aluminum or an aluminum alloy that is bonded to one surface of a ceramic substrate, and a metal base plate, wherein one surface of the metal base plate made of aluminum or an aluminum alloy is bonded to another surface of the ceramic substrate, and another surface of the metal base plate is bonded to a radiator, the method including: bonding the metal circuit board and the metal base plate to the ceramic substrate to form a metal-ceramic bonded substrate; then arranging the metal base plate of the metal-ceramic bonded substrate on one surface of the radiator via a brazing material with the metal base plate overlapping with the one surface of the radiator; arranging a jig having a concave R surface on another surface of the radiator with the jig butting against the another surface of the radiator; bringing a jig having a convex R surface protruding toward the metal-ceramic bonded substrate into contact with another surface of the metal circuit board of the metal-ceramic bonded substrate; and heat-bonding the metal-ceramic bonded substrate and the radiator while pressurizing the metal-ceramic bonded substrate and the radiator by the jig arranged on the radiator side and the jig arranged on the metal-ceramic bonded substrate side, wherein a curvature radius R (mm) of the convex R surface and the concave R surface is $$6500 \leq R \leq \text{surface pressure}(N/mm^2) \times 2000 + 12000.$$

The ceramic substrate may be rectangular, and a long side thereof may be 40 mm or more. Further, the surface pressure applied to the metal circuit board may be 1.0 $N/mm^2$ or more.

The surface pressure applied to the metal circuit board may be 5.0 $N/mm^2$ or less.

It is preferable that a thickness t1 of the metal circuit board and a thickness t2 of the metal base plate satisfy t2/t1≥2, and t1 is 0.4 to 3 mm and t2 is 0.8 to 6 mm.

The radiator may be an extrusion member made of aluminum or an aluminum alloy. Further, bonding of the ceramic substrate and the metal circuit board and bonding of the ceramic substrate and the metal base plate may be performed by a molten metal bonding method.

Further, according to the present invention, a radiator-integrated substrate manufactured by any one of the above manufacturing methods is provided. In the radiator-integrated substrate, it is preferable that a warpage amount of a front surface of the metal circuit board of the metal-ceramic bonded substrate after the metal-ceramic bonded substrate and the radiator are braze-bonded together is 2 μm/mm or less.

Further, according to the present invention, there is provided a radiator-integrated substrate in which one surface of a metal circuit board made of aluminum or an aluminum alloy that is bonded to one surface of a ceramic substrate, and a metal base plate, wherein one surface of the metal base plate made of aluminum or an aluminum alloy is bonded to another surface of the ceramic substrate, and another surface of the metal base plate is bonded to a radiator via a brazing material, wherein the ceramic substrate is rectangular and a long side thereof is 40 mm or more, and a warpage amount of a front surface of the metal circuit board of the metal-ceramic bonded substrate is 2 μm/mm or less.

Effect of the Invention

According to the present invention, there are provided a manufacturing method of a radiator-integrated substrate and a radiator-integrated substrate in which a raw material cost and a processing cost are suppressed and warpage (shape distortion) as the radiator-integrated substrate is reduced and which has excellent strength and heat radiation property.

BEST MODE FOR CARRYING OUT THE INVENTION

Hereinafter, an embodiment of the present invention will be described referring to the drawings. Note that the same reference numerals are given to elements having substantially the same functional configurations in the description and the drawings to omit repeated description.

Figure 1:
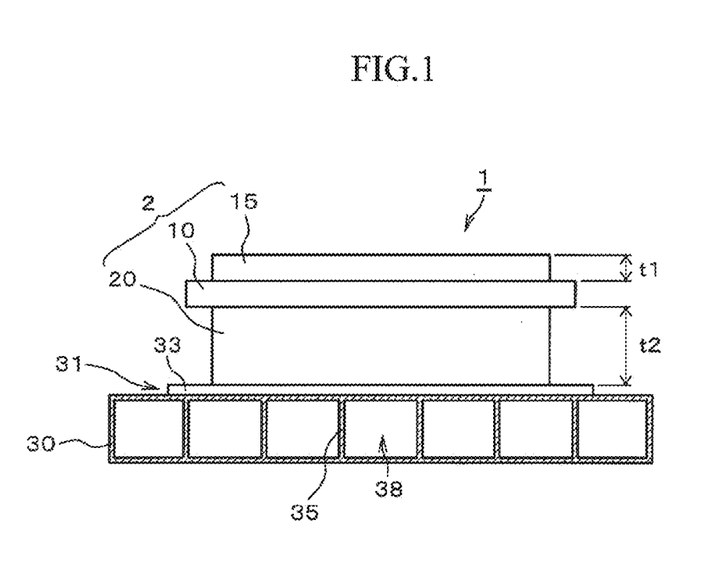
FIG. 1 A front view of a radiator-integrated substrate.

FIG. 1 is a front view of a radiator-integrated substrate 1 according to an embodiment of the present invention. As illustrated in FIG. 1, in the radiator-integrated substrate 1, a metal circuit board 15 made of aluminum or an aluminum alloy containing at least one element selected from among Si, Mg, Zn, Bi, Sn is bonded to an upper surface (an upper part in FIG. 1) of a ceramic substrate 10 being, for example, an AlN substrate (an aluminum nitride substrate) or a SiN substrate (a silicon nitride substrate). Further, a metal base plate 20 made of aluminum or an aluminum alloy containing at least one element selected from among Si, Mg, Zn, Bi, Sn is bonded to a lower surface (a lower part in FIG. 1) of the ceramic substrate 10. Further, a radiator 30 composed of a porous pipe in a hollow square pillar shape composed of an extrusion member is bonded to a lower surface (a lower part in FIG. 1) of the metal base plate 20. Note that the radiator 30 is a liquid-cooled radiator in this embodiment.

Bonding of the ceramic substrate 10 and the metal circuit board 15 and bonding of the ceramic substrate 10 and the metal base plate 20 are performed, for example, by the molten metal bonding method, to form a metal-ceramic bonded substrate 2. Further, bonding of the metal base plate 20 and the radiator 30 is performed by the braze-bonding method. More specifically, in the bonding of the metal base plate 20 and the radiator 30, a brazing material layer 33 for the bonding is formed in a gap part 31 between them in this embodiment.

As illustrated in FIG. 1, the radiator 30 has a hollow inner space, and partition plates (ribs, heat radiation fins) 35 partitioning the inner space are provided. In the radiator 30 according to this embodiment, the partition plates 35 are provided to partition the inner space into seven parts as illustrated in the drawing, a plurality of (seven) flow paths 38 are formed by the partition plates 35 in the inner space of the radiator 30. The radiator 30 provided with the partition plates 35 is molded as one unit body by the extrusion processing.

Figure 2:
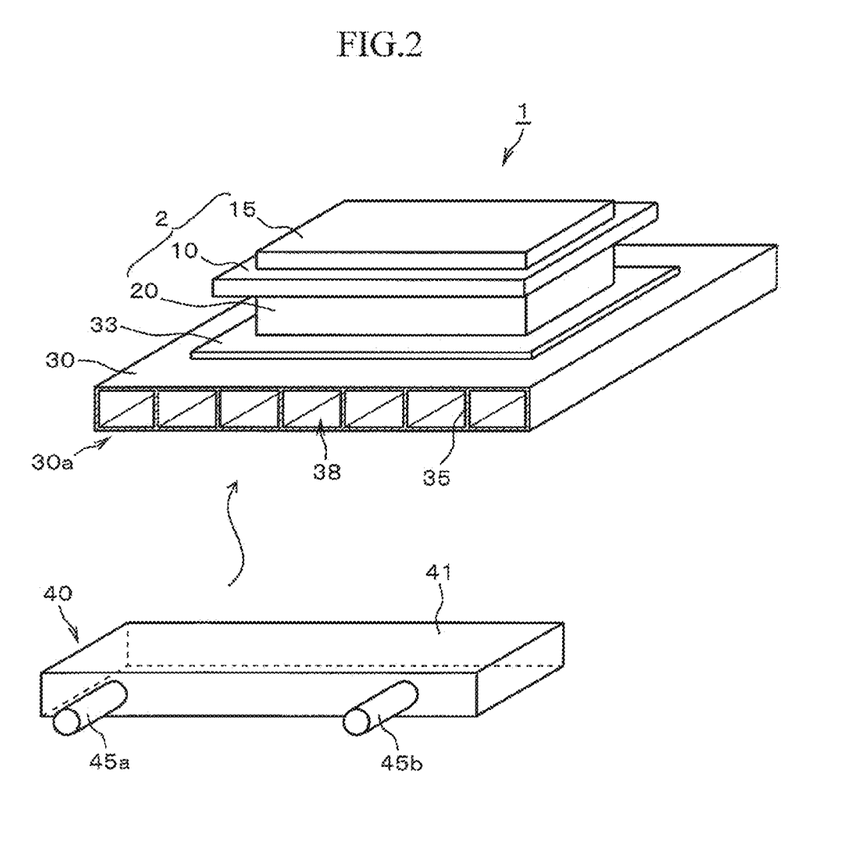
FIG. 2 A perspective view of the radiator-integrated substrate and a lid member.

FIG. 2 is a perspective view of the radiator-integrated substrate 1 and a lid member 40. The lid member 40 is a member to be attached in a manner to cover a side surface 30a of an opening on the front side (the front side in FIG. 2) of the radiator 30. The lid member 40 is composed of a lid part 41 and liquid circulation ports 45a, 45b provided at two positions on a side surface of the lid part 41 (a surface corresponding to the side surface 30a when attached to the radiator 30). Further, in the radiator 30, at an opening provided on the opposite side to the opening on the front side in FIG. 2, a lid member (not-illustrated) is attached that is similar except that it does not have the liquid circulation ports. The lid member 40 is actually attached to the radiator 30 when liquid cooling is actually performed because of heat generation of a semiconductor element or the like attached to the metal circuit board 15 in the radiator-integrated substrate 1. A not-illustrated cooling liquid circulation mechanism is connected to the liquid circulation ports 45a, 45b, and a cooling liquid is supplied from the cooling liquid circulation mechanism to the inside (the flow paths 38) of the radiator 30 via the liquid circulation port 45a and the cooling liquid is discharged from the inside of the radiator 30 via the liquid circulation port 45b to the cooling liquid circulation mechanism. In other words, the cooling liquid circulates between the inside of the radiator 30 and the cooling liquid circulation mechanism such that the cooling liquid flows into the flow paths 38 by the operation of the cooling liquid circulation mechanism and then returns again to the cooling liquid circulation mechanism, thereby keeping the cooling capacity of the radiator 30 constant. The lid member 40 and the radiator 30 may be subjected to braze-bonding concurrently with the braze-bonding of the metal base plate 20 and the radiator 30.

On the other hand, in the metal-ceramic bonded substrate 2 in the radiator-integrated substrate 1 according to this embodiment, the relation between a thickness (height) t1 of the metal circuit board 15 and a thickness (height) t2 of the metal base plate 20 is preferably t2/t1≥2 (see FIG. 1). As for respective values at this time, t1 is preferably 0.4 to 3 mm and t2 is preferably 0.8 to 6 mm. The reason why the relation between the thickness t1 of the metal circuit board 15 and the thickness t2 of the metal base plate 20 is desirably t2/t1≥2 is to obtain sufficient heat radiation performance of transient heat and to suppress warpage of the integrated substrate. Further, the reason why t1 is desirably 0.4 to 3 mm and t2 is desirably 0.8 to 6 mm is to obtain sufficient heat radiation performance of transient heat and to suppress warpage of the integrated substrate. Note that it is more preferable that t2 is 0.8 to 3 mm.

Note that the material of the radiator 30 is desirably, for example, aluminum or an aluminum alloy containing at least one element selected from among Si, Mg, Zn, Bi, Sn.

When the radiator-integrated substrate 1 described above referring to FIG. 1 and FIG. 2 is used while, for example, an electronic component such as a semiconductor element is attached to the metal circuit board 15, the heat generated from the electronic component is radiated by the radiator 30 in which the cooling liquid circulates as described above, whereby the whole radiator-integrated substrate 1 is cooled. Here, the radiator-integrated substrate 1 providing sufficient heat radiation performance is obtained because the relation between the thickness t1 of the metal circuit board 15 and the thickness t2 of the metal base plate 20 is t2/t1≥2 and t1 is 0.4 to 3 mm and t2 is 0.8 to 6 mm as described above.

Furthermore, sufficient bonding reliability is ensured by bonding the members such as the metal circuit board 15, the metal base plate 20, and the radiator 30 together using the molten metal bonding method and the braze-bonding method.

In the present invention, the metal base plate 20 and the radiator 30 are bonded together by the above-described brazing. The brazing is performed by inserting the brazing material layer 33 composed of a single layer brazing sheet having, for example, an Al—Si—Mg alloy composition between the metal base plate 20 and the radiator 30, applying a predetermined load thereon in a state of bringing them into surface contact, and heating them up to a predetermined brazing temperature in a brazing furnace. Note that the brazing sheet is brazing material foil.

Figure 3:
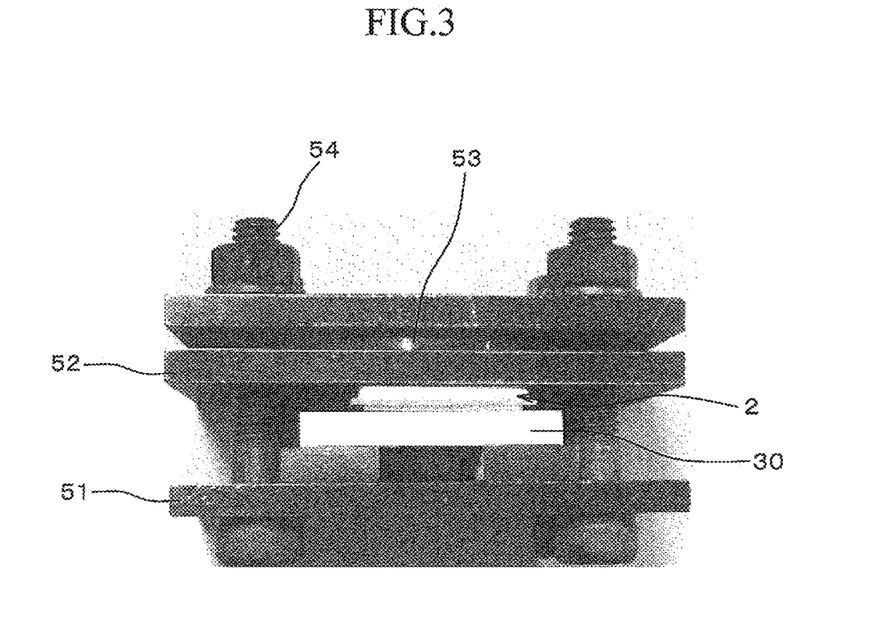
FIG. 3 A photograph of an example of a manufacturing method of the radiator-integrated substrate as viewed from the front.

FIG. 3 is an example of an embodiment when brazing the metal base plate 20 of the metal-ceramic bonded substrate 2 and the radiator 30. As illustrated in FIG. 3, a brazing material with sizes (length and width) equal to or larger than those of the aluminum part of the metal base plate 20 is set on the radiator 30 mounted on a radiator side jig 51, and the metal-ceramic bonded substrate 2 is placed on the brazing material. Further, on the metal-ceramic bonded substrate 2, a disc spring 53 is set via a metal-ceramic bonded substrate side jig 52, and bolts 54 clamp them to apply a predetermined load (surface pressure) thereon.

Figure 4:
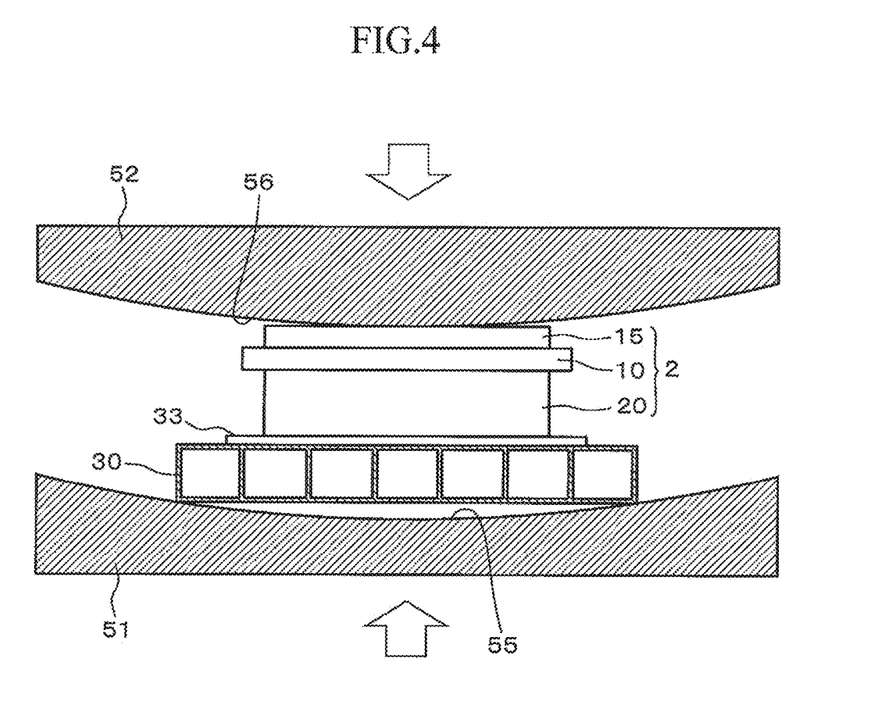
FIG. 4 A front view illustrating the manufacturing method of the radiator-integrated substrate according to an embodiment of the present invention.
Figure 5:
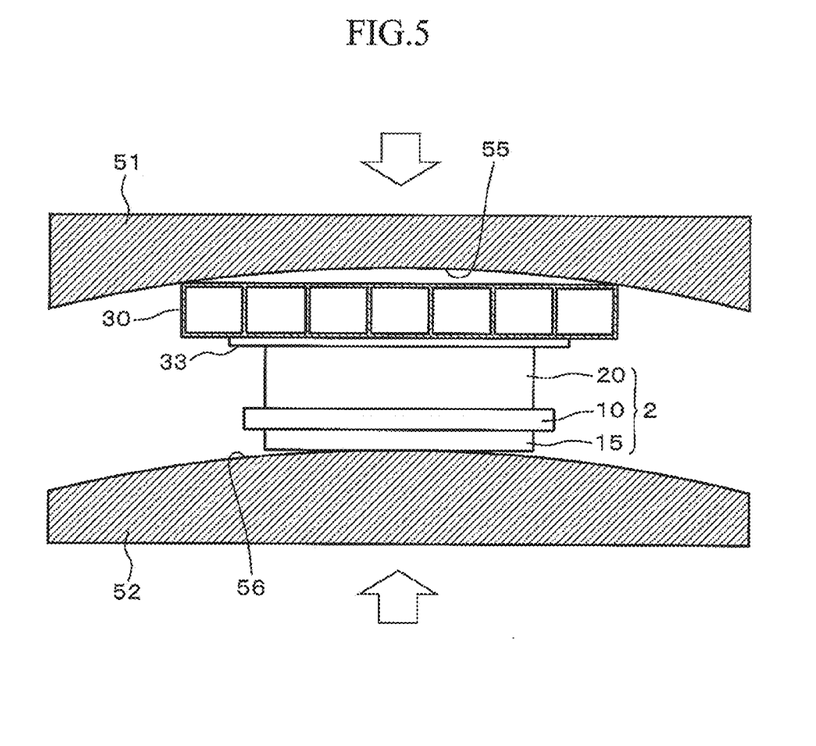
FIG. 5 A front view illustrating another manufacturing method of the radiator-integrated substrate according to the embodiment of the present invention.

In the present invention, the radiator side jig 51 has a concave R surface and the metal-ceramic bonded substrate side jig 52 has a convex R surface. More specifically, as illustrated in FIG. 4, the radiator side jig 51 has a concave R surface 55 having a recess formed on the radiator side below the radiator 30, and the metal-ceramic bonded substrate side jig 52 has a convex R surface 56 protruding toward the metal-ceramic bonded substrate 2. When the radiator-integrated substrate 1 is arranged upside down with respect to FIG. 4, namely, when the radiator 30 is located on the upper side, the arrangement of the jigs is upside down such that the convex R surface 56 is placed on the metal-ceramic bonded substrate side jig 52 on the lower side and the concave R surface 55 is located on the radiator side jig 51 on the upper side as illustrated in FIG. 5.

In FIG. 4, the concave R surface 55 of the radiator side jig 51 and the convex R surface 56 of the metal-ceramic bonded substrate side jig 52 are formed on the entire surfaces respectively. However, formation ranges (regions) of the R surfaces formed on the radiator side jig 51 and the metal-ceramic bonded substrate side jig 52 in the present invention do not always need to be formed on the entire surfaces. The formation ranges (regions) of the R surfaces formed on the radiator side jig 51 and the metal-ceramic bonded substrate side jig 52 may be ranges (regions) to a degree capable of covering the entire radiator 30 or may be smaller ranges (regions) than those as long as they are ranges (regions) capable of covering the entire metal circuit board 15 at a minimum. As a matter of course, in the case of braze-bonding one metal-ceramic bonded substrate 2 to one radiator 30, it is preferable that the formation ranges (regions) of the R surfaces extend over the entire surfaces of the radiator side jig 51 and the metal-ceramic bonded substrate side jig 52.

Figure 6:
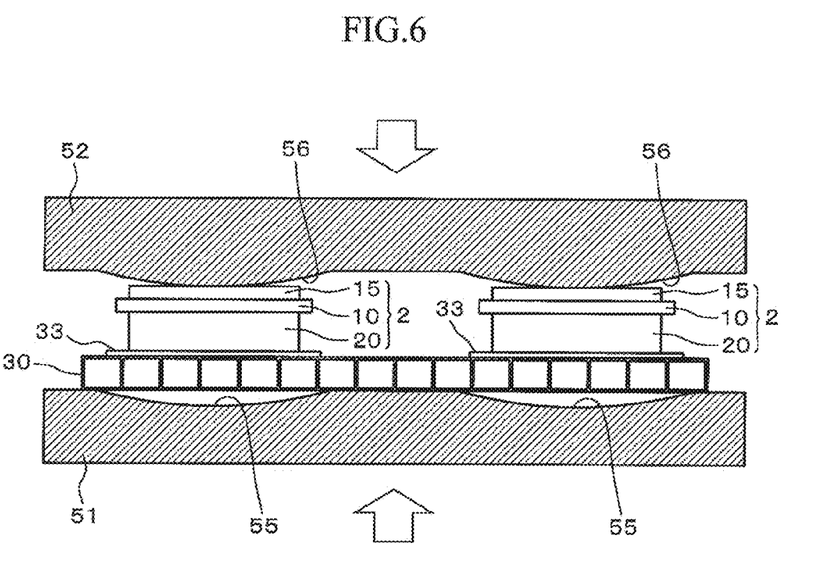
FIG. 6 A front view illustrating still another manufacturing method of the radiator-integrated substrate according to the embodiment of the present invention.
Figure 7:
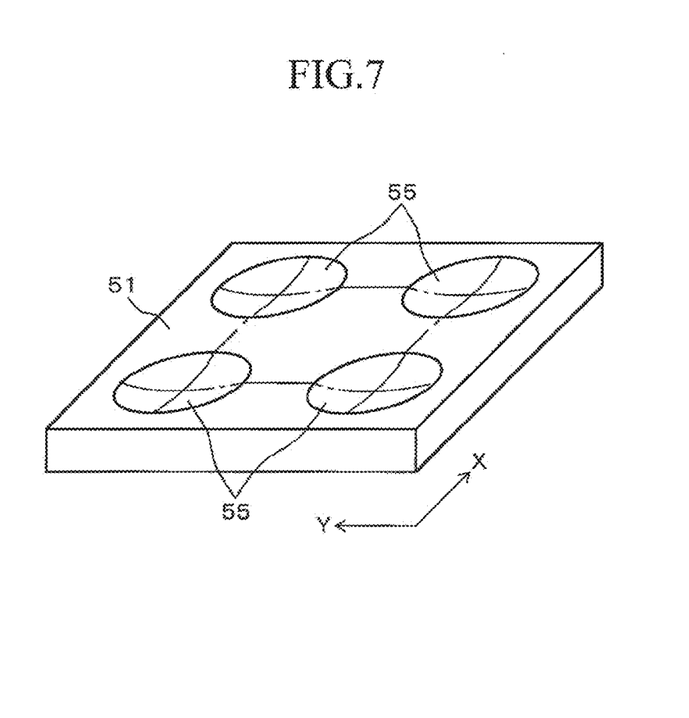
FIG. 7 A perspective view of a radiator side jig.

Further, in the case of concurrently bonding a plurality of metal-ceramic bonded substrates 2 to one radiator 30, the jigs 51, 52 having the concave R surface 55 and convex R surface 56 formed for each of the metal-ceramic bonded substrates 2 as illustrated in FIG. 6 are used. For example, in the case of bonding four metal-ceramic bonded substrates 2 to one radiator 30, a jig having four concave R surfaces 55 as illustrated in FIG. 7 is used as the radiator side jig 51. The metal-ceramic bonded substrate side jig also similarly has four convex R surfaces 56 facing the concave R surfaces 55.

As described above, in the case of bonding a plurality of metal-ceramic bonded substrates 2 to one radiator 30, a plurality of R surfaces are also formed in each of the radiator side jig 51 and the metal-ceramic bonded substrate side jig 52. In such a case, the formation ranges of the R surfaces to be formed in the radiator side jig 51 and the metal-ceramic bonded substrate side jig 52 only need to be ranges (regions)

so that the formation range of one R surface is a range (region) capable of covering at least one metal circuit board 15, and are preferably ranges (regions) where the plurality of R surfaces formed in the radiator side jig 51 or the metal-ceramic bonded substrate side jig 52 do not interfere with each other.

In the above embodiment, the concave R surface 55 and the convex R surface 56 may have the same curvature in an X-direction and a Y-direction (see FIG. 7), or may be different in curvature according to the dimension and so on of a ceramic substrate. In other words, a curved surface may be a spherical surface having a constant curvature radius (R dimension) or may be a curved surface (aspheric surface) having a variable curvature radius (R dimension), as long as it is a smooth curved surface. Further, the concave R surface 55 and the convex R surface 56 may be formed only in the X-direction or only in the Y-direction. In other words, they may be a concave groove R surface 55 extending in the Y-direction and a convex projection R surface 56 extending in the Y-direction or may be a concave groove R surface 55 extending in the X-direction and a convex projection R surface 56 extending in the X-direction. Further, as a matter of course, cross-sectional shapes vertical to the Y-direction of the concave groove R surface 55 extending in the Y-direction and the convex projection R surface 56 extending in the Y-direction may be circular arc shapes or may be non-circular arc shapes as long as they are smooth curved shapes. Furthermore, the cross-sectional shapes vertical to the X-direction of the concave groove R surface 55 extending in the X-direction and the convex projection R surface 56 extending in the X-direction may be circular arc shapes or may be non-circular arc shapes as long as they are smooth curved shapes.

By bonding using the jigs 51, 52 having the R surfaces as described above, the warpage on the surface (another surface that is not bonded to the ceramic substrate 10) of the metal circuit board 15 is reduced even if the size of the ceramic substrate 10 is large, so that the radiator-integrated substrate 1 is obtained which has an absolute value of warpage amount per unit length of the front surface of the metal circuit board 15 of the metal-ceramic bonded substrate 2 after the braze-bonding of 2 µm/mm or less. In particular, the present invention is effective to the case where the ceramic substrate is rectangular and has a long side of 40 mm or more, more preferably 50 mm or more, and the bonding is preferably performed with a surface pressure applied to the front surface of the metal circuit board 15 of 1.0 N/mm² or more. Note that the surface pressure is obtained by dividing the load applied to the jig by the surface area of the metal circuit board 15. However, since the radiator 30 may be deformed when the surface pressure exceeds 5.0 N/mm², the surface pressure is preferably 5.0 N/mm² or less. Note that the absolute value of the warpage amount per unit length of the front surface of the metal circuit board 15 is more preferably 1.5 µm/mm or less, and the surface pressure more preferably falls within a range of 1.5 to 3.0 N/mm².

Further, a curvature radius R of the concave R surface 55 and the convex R surface 56 is preferably $$6500 \leq R \leq \text{surface pressure}(N/mm^2) \times 2000 + 12000 \quad (1).$$

When the curvature radius R is small, the warpage amount of the front surface of the metal circuit board 15 of the metal-ceramic bonded substrate 2 can be reduced with a small surface pressure that pressurizes the front surface of the metal circuit board 15, however when R is too small, breakage may occur in the radiator-integrated substrate. Further, when R is too large, the R surface comes closer to a flat surface and the effect of the present invention reduces. A more preferable curvature radius R is $7000 \leq R \leq$ surface pressure $(N/mm^2) \times 2000 + 11000$.

A preferred embodiment of the present invention has been described above, but the present invention is not limited to the embodiment. It should be understood that various changes and modifications are readily apparent to those skilled in the art within the scope of the technical spirit as set forth in claims, and those should also be covered by the technical scope of the present invention.

EXAMPLES

A test was carried out in which a metal-ceramic bonded substrate "ALMIC" (registered trademark) made by molten-metal bonding (direct-bonding) an aluminum alloy on both surfaces of an AlN substrate and a porous pipe (radiator) were brazed together using jigs having a concave R surface and a convex R surface to manufacture a radiator-integrated substrate.

First of all, radiators composed of porous pipes (material: made of an aluminum alloy with an alloy number A6063, solidus temperature: 615° C.) of two sizes such as a width of 127 mm×a length of 140 mm×a thickness of 8 mm (Invention Examples 1 to 10, Comparative Examples 1 to 5, Comparative Examples 8 to 11), and a width of 150 mm×a length of 140 mm×a thickness of 10 mm (Invention Example 11, Comparative Examples 6, 7) were prepared. In each of the radiators composed of porous pipes, a plurality of pipes of refrigerant flow paths were consecutively arranged as illustrated in FIG. 1, and a groove width W (width of pipe) of the refrigerant flow path was 1.515 mm and a groove depth D (height of pipe) was 6.06 mm (Invention Examples 1 to 10, Comparative Examples 1 to 5, Comparative Examples 8 to 11), or a groove width W of the refrigerant flow path was 1.515 mm and a groove depth D was 8.08 mm (Invention Example 11, Comparative Example 6, Comparative Example 7), and a width of the partition plate (rib thickness, heat radiation fin thickness) was 0.707 mm, a thickness of the partition plate (rib thickness, heat radiation fin thickness) was 0.707 mm, and thicknesses of an upper plate (ceiling plate) and a lower plate (bottom plate) were 1.01 mm.

Further, as the metal-ceramic bonded substrate, the dimensions of a metal circuit board made of an aluminum alloy were set to a short side of 59 mm×a long side of 68 mm×a thickness (t1) of 0.4 mm (Invention Example 1), a short side of 48 mm×a long side of 98 mm×a thickness of 0.4 mm (Invention Examples 2 to 6, Comparative Examples 7 to 11), a short side of 58 mm×a long side of 78 mm×a thickness of 0.4 mm (Invention Examples 7 to 11, Comparative Examples 4 to 6), and a short side of 53 mm×a long side of 53 mm×a thickness of 0.4 mm (Comparative Examples 1 to 3). The dimensions of the ceramic substrate were set to a short side of 61 mm×a long side of 70 mm×a thickness of 0.63 mm (Invention Example 1), a short side of 50 mm×a long side of 100 mm×a thickness of 0.635 mm (Invention Examples 2 to 6, Comparative Examples 7 to 11), a short side of 60 mm×a long side of 80 mm×a thickness of 0.635 mm (Invention Examples 7 to 11, Comparative Examples 4 to 6), and a short side of 55 mm×a long side of 55 mm×a thickness of 0.635 mm (Comparative Examples 1 to 3). The dimensions of the metal base plate 20 made of an aluminum alloy were set to a short side of 59 mm×a long side of 68 mm×a thickness (t2) of 1.6 mm (Invention Example 1), a short side of 48 mm×a long side of 98 mm×a thickness of 1.6 mm (Invention Examples 2 to 6, Comparative Examples 7 to 11), a short side of 58 mm×a long side of 78 mm×a thickness of 1.6 mm (Invention Examples 7 to 11, Comparative Examples 4 to 6), and a short side of 53 mm×a long side of 53 mm×a thickness of 1.6 mm (Comparative Examples 1 to 3). The materials of the metal circuit board and the metal base plate were pure Al with a purity of 99.9 mass % or more. Note that each of the metal circuit board and the metal base plate was a rectangular parallelepiped (plate shape) and bonded to the ceramic substrate by the molten metal bonding method and arranged at the center of the ceramic substrate.

In Examples, the concave R surface 55 of the radiator side jig 51 and the convex R surface 56 of the metal-ceramic bonded substrate side jig 52 illustrated in FIG. 4 were formed only in the Y-direction (the lateral direction in the drawing). Namely, the concave R surface 55 of the radiator side jig 51 and the convex R surface 56 of the metal-ceramic bonded substrate side jig 52 are the concave groove R surface 55 extending in the X-direction (in a depth direction vertical to the plane of paper) and the convex projection R surface 56 extending in the X-direction (in the depth direction vertical to the plane of paper). Further, the test was carried out using the concave groove R surface 55 of the radiator side jig 51 and convex projection R surface 56 of the metal-ceramic bonded substrate side jig 52 extending in the X-direction which were formed on the entire surfaces of the radiator side jig 51 and the metal-ceramic bonded substrate side jig 52. Namely, in the brazing test in Examples, the radiator 30, the brazing material layer 33, and the metal-ceramic bonded substrate 2 are stacked in order from the bottom with a portion of an edge line extending in the X-direction (the depth direction of the drawing) belonging to the bottom surface of the radiator 30 illustrated in FIG. 4 in contact with the concave groove R surface 55 of the radiator side jig 51, and the bonded members are fixed with pressure while being sandwiched between the concave groove R surface 55 of the radiator side jig 51 and the convex projection R surface 56 of the metal-ceramic bonded substrate side jig 52.

As illustrated in FIG. 3, a brazing material (composition: 10 mass % Si-1.5 mass % Mg-inevitable impurities and balance Al, a thickness of 15 μm) having the same sizes (length and width) as those of the aluminum portion of the metal base plate of the metal-ceramic bonded substrate 2 was set on the radiator 30, the metal-ceramic bonded substrate 2 was placed on the brazing material, the disc spring 53 of "Inconel" (registered trademark) was set on the metal-ceramic bonded substrate 2 via the jig, and they were clamped with the bolts 54 so that a predetermined load (surface pressure) was applied thereon.

As for Invention Examples, the surface pressure was set to 2.1 N/mm² in Invention Example 1, 2.7 N/mm² in Invention Examples 2 to 6, 8 to 11, and 1.8 N/mm² in Invention Example 7. Note that the surface pressure was calculated by dividing the load applied in each of Invention Examples by the surface area of the metal circuit board. The R dimension (curvature radius) of the concave groove and convex projection R surfaces of the radiator side jig 51 and the metal-ceramic bonded substrate side jig 52 was 8167 mm in Invention Example 1, 10417 mm in Invention Examples 2 to 6, 8000 mm in Invention Examples 7, 8, and 16000 mm in Invention Examples 9 to 11. The R dimensions of the concave groove and convex projection R surfaces were the same. Note that the surface pressure was calculated by dividing the load applied to each of Invention Examples by the surface area of the metal circuit board. In each of Invention Examples, the R dimension was set to fall within the range of R obtained by the above Expression (1) with respect to the surface pressure. Note that before the clamping with the bolts, flux was not applied on the surface of the brazing material, the bonding surface of the radiator, and the boding surface of the metal base plate.

Further, as for Comparative Examples, the surface pressure was set to 1.8 N/mm² in Comparative Examples 1 to 6, 1.7 N/mm² in Comparative Example 7, and 3.2 N/mm² in Comparative Examples 8 to 11. Note that the surface pressure was calculated by dividing the load applied in each of Comparative Examples by the surface area of the metal circuit board. The R dimension (curvature radius) of the concave groove and convex projection R surfaces of the jigs was a flat surface (R was infinite) in Comparative Examples 1 to 4, 7 to 10, 16000 mm in Comparative Examples 5, 6, and 6250 mm in Comparative Example 11. The dimensions of the concave groove and convex projection R surfaces were the same. Further, the test was carried out for each of the case of using jigs with flat surfaces in which R surfaces were not formed, the case where the R dimension exceeded the upper limit obtained by the Expression (1), and the case where the R dimension was smaller than 6500 mm as Comparative Examples.

Next, the metal-ceramic bonded substrate and the radiator were set in a brazing furnace in a nitrogen atmosphere, then increased in temperature at 50° C./min up to 500° C. and at 10° C./min up to 605° C., then kept at 605° C. being the brazing temperature for ten minutes, and then cooled at 15° C./min down to 250° C. After the radiator 30 and the metal base plate 20 were brazed together, the warpage amount of the front surface of the metal circuit board 15 of the metal-ceramic bonded substrate 2 in the long side direction of the ceramic substrate 10 was measured. The warpage amount of the front surface of the metal circuit board 15 was calculated by measuring a height difference (μm) between both end portions (both end sides) on the long sides and a central portion of the metal circuit board 15 using a three-dimensional surface roughness tester on the front surface (another surface) of the metal circuit board 15 and dividing the height difference (μm) by a long side length (mm) of the metal circuit board 15. Namely, the "warpage amount" in the Description means the value obtained by dividing the height difference (μm) in the thickness direction on the front surface (another surface) of the metal circuit board 15 after brazing by the long side length (mm) of the metal circuit board 15.

Figure 8:
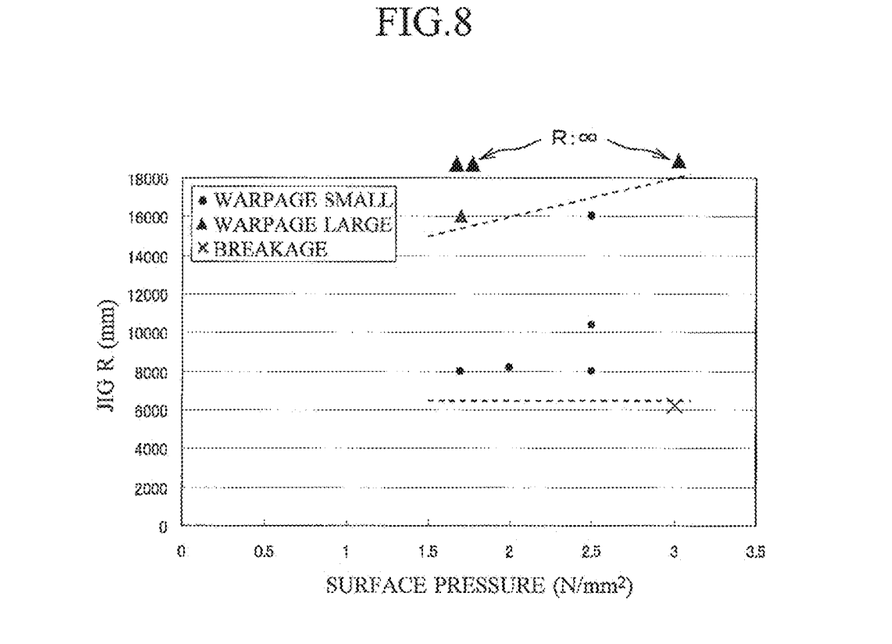
FIG. 8 A graph illustrating results of Examples.

Test conditions and test results of above Invention Examples 1 to 11 and Comparative Examples 1 to 11 are listed in Table 1 and FIG. 8.

TABLE 1

| | METAL-CERAMIC BONDED SUBSTRATE | | | | | | | | PRESSURIZE | | CONCAVE AND CONVEX PART WARPAGE μm/mm | JIG | | | EVALUATION WARPAGE AMOUNT ** μm/mm | Remarks |
| | POROUS PIPE | | Al | | SIZE OF CERAMIC SUBSTRATE mm | BRAZING DIRECTION | LENGTH OF LONG SIDE OF CERAMIC SUBSTRATE mm | LENGTH OF LONG SIDE OF Al CIRCUIT BOARD mm | SURFACE LOAD N | SURFACE PRESSURE N/mm² | | R CONVERSION mm | R UPPER LIMIT * mm | | |
| | THICKNESS mm | LENGTH × WIDTH mm | THICKNESS FRONT/REAR mm | | | | | | | | | | | | |
| INVENTION EXAMPLE 1 | 8 | 127 × 140 | 0.4/1.6 | | 61 × 70 × 0.635 | VERTICAL TO RIB | 70 | 68 | 8540 | 2.1 | 75/70 | 8167 | 16200 | 0.8 | |
| INVENTION EXAMPLE 2 | 8 | 127 × 140 | 0.4/1.6 | | 50 × 100 × 0.635 | VERTICAL TO RIB | 100 | 98 | 12500 | 2.7 | 120/100 | 10417 | 17400 | 0.3 | |
| INVENTION EXAMPLE 3 | 8 | 127 × 140 | 0.4/1.6 | | | PARALLEL TO RIB | | | 12500 | 2.7 | 120/100 | 10417 | 17400 | 1.5 | |
| INVENTION EXAMPLE 4 | 8 | 127 × 140 | 0.4/1.6 | | | PARALLEL TO RIB | | | 12500 | 2.7 | 120/100 | 10417 | 17400 | 0.5 | |
| INVENTION EXAMPLE 5 | 8 | 127 × 140 | 0.4/1.6 | | | VERTICAL TO RIB | | | 12500 | 2.7 | 120/100 | 10417 | 17400 | 1.0 | |
| INVENTION EXAMPLE 6 | 8 | 127 × 140 | 0.4/1.6 | | | PARALLEL TO RIB | | | 12500 | 2.7 | 120/100 | 10417 | 17400 | 0.9 | |
| INVENTION EXAMPLE 7 | 8 | 127 × 140 | 0.4/1.6 | | 60 × 80 × 0.635 | PARALLEL TO RIB | 80 | 78 | 8000 | 1.8 | 100/80 | 8000 | 15600 | -1.0 | R SMALL, REVERSE WARPAGE |
| INVENTION EXAMPLE 8 | 8 | 127 × 140 | 0.4/1.6 | | | PARALLEL TO RIB | | | 12000 | 2.7 | 100/80 | 8000 | 17400 | -1.2 | R SMALL, REVERSE WARPAGE |
| INVENTION EXAMPLE 9 | 8 | 127 × 140 | 0.4/1.6 | | | PARALLEL TO RIB | | | 12000 | 2.7 | 50/80 | 16000 | 17400 | 1.3 | |
| INVENTION EXAMPLE 10 | 8 | 127 × 140 | 0.4/1.6 | | | VERTICAL TO RIB | | | 12000 | 2.7 | 50/80 | 16000 | 17400 | 1.2 | |
| INVENTION EXAMPLE 11 | 10 | 150 × 140 | 0.4/1.6 | | | PARALLEL TO RIB | | | 12000 | 2.7 | 50/80 | 16000 | 17400 | 1.3 | |
| COMPARATIVE EXAMPLE 1 | 8 | 127 × 140 | 0.4/1.6 | | 55 × 55 × 0.635 | PARALLEL TO RIB | 55 | 53 | 5100 | 1.8 | 0 | ∞ (FLAT SURFACE) | 15600 | 2.3 | |
| COMPARATIVE EXAMPLE 2 | 8 | 127 × 140 | 0.4/1.6 | | | PARALLEL TO RIB | | | 5100 | 1.8 | 0 | ∞ (FLAT SURFACE) | 15600 | 2.9 | |
| COMPARATIVE EXAMPLE 3 | 8 | 127 × 140 | 0.4/1.6 | | | PARALLEL TO RIB | | | 5100 | 1.8 | 0 | ∞ (FLAT SURFACE) | 15600 | 2.5 | |
| COMPARATIVE EXAMPLE 4 | 8 | 127 × 140 | 0.4/1.6 | | 60 × 80 × 0.635 | VERTICAL TO RIB | 80 | 78 | 8000 | 1.8 | 0 | ∞ (FLAT SURFACE) | 15600 | 2.4 | |
| COMPARATIVE EXAMPLE 5 | 8 | 127 × 140 | 0.4/1.6 | | | PARALLEL TO RIB | | | 8000 | 1.8 | 50/80 | 16000 | 15600 | 2.3 | R LARGE, INSUFFICIENT SURFACE PRESSURE |
| COMPARATIVE EXAMPLE 6 | 10 | 150 × 140 | 0.4/1.6 | | | PARALLEL TO RIB | | | 8000 | 1.8 | 50/80 | 16000 | 15600 | 2.1 | R LARGE, INSUFFICIENT SURFACE PRESSURE |

TABLE 1-continued

| | METAL-CERAMIC BONDED SUBSTRATE | | | | | | | PRESSURIZE | | | JIG | | EVALUATION | |
|---|---|---|---|---|---|---|---|---|---|---|---|---|---|---|
| | POROUS PIPE | | Al | | SIZE OF CERAMIC SUBSTRATE mm | BRAZING DIRECTION | LENGTH OF LONG SIDE OF CERAMIC SUBSTRATE mm | LENGTH OF LONG SIDE OF Al CIRCUIT BOARD mm | SURFACE LOAD N | SURFACE PRESSURE N/mm² | CONCAVE AND CONVEX PART WARPAGE μm/mm | R CONVERSION mm | R UPPER LIMIT* mm | WARPAGE AMOUNT** μm/mm | Remarks |
| | THICKNESS mm | LENGTH × WIDTH mm | THICKNESS mm | FRONT /REAR mm | | | | | | | | | | | |
| COMPARATIVE EXAMPLE 7 | 10 | 150 × 140 | 0.4/1.6 | | 50 × 100 × 0.635 | VERTICAL TO RIB | 100 | 98 | 8000 | 1.7 | 0 | ∞ (FLAT SURFACE) | 15400 | 3.1 | |
| COMPARATIVE EXAMPLE 8 | 8 | 127 × 140 | 0.4/1.6 | | | | | | 15000 | 3.2 | 0 | ∞ (FLAT SURFACE) | 18400 | 2.3 | |
| COMPARATIVE EXAMPLE 9 | 8 | 127 × 140 | 0.4/1.6 | | | | | | 15000 | 3.2 | 0 | ∞ (FLAT SURFACE) | 18400 | 2.4 | |
| COMPARATIVE EXAMPLE 10 | 8 | 127 × 140 | 0.4/1.6 | | | | | | 15000 | 3.2 | 0 | ∞ (FLAT SURFACE) | 18400 | 2.3 | |
| COMPARATIVE EXAMPLE 11 | 8 | 127 × 140 | 0.4/1.6 | | | | | | 15000 | 3.2 | 200/100 | 6250 | 18400 | BREAKAGE | R SMALL, BREAKAGE |

*UPPER LIMIT VALUE OBTAINED BY EXPRESSION (1)
**UPWARD PROTRUDING WARPAGE INDICATED AS "+"

In each of Invention Examples, the warpage amount of the front surface of the metal circuit board 15 of the metal-ceramic bonded substrate 2 after brazing was 2 μm/mm or less. In Invention Examples 7, 8, the metal circuit board was warped in a direction in which the metal circuit board protruded to the lower side (minus indication in Table) because of a slightly small R dimension, but the condition that the absolute value of the warpage amount of a front surface of the metal circuit board of the metal-ceramic bonded substrate is 2 μm/mm or less that is the target was satisfied.

In contrast, in each of Comparative Examples, the warpage amount of the front surface of the metal circuit board 15 of the metal-ceramic bonded substrate 2 exceeded 2 μm/mm. In Comparative Examples 1 to 4 and Comparative Examples 7 to 10, the jigs were flat surfaces in which R surfaces were not formed, so that even if the surface pressure was made larger than that in Invention Example, the warpage amount could not be suppressed to 2 μm/mm or less. In Comparative Examples 5, 6, since the surface pressure was lower than those of Invention Examples 9 to 11 with the same R dimension and did not satisfy Expression (1), the warpage amount of the front surface of the metal circuit board exceeded 2 μm/mm. Further, in Comparative Example 11 with the R dimension of less than 6500 mm, breakage occurred in the ceramic substrate. The warpage amount of the front surface of the metal circuit board of the metal-ceramic bonded substrate 2 exceeding 2 μm/mm is not desirable as the radiator-integrated substrate because variation occurs in thickness of solder depending on the position on the ceramic substrate after a semiconductor chip is soldered to cause variation in thermal resistance.

FIG. 8 expresses the results in Table 1 such as "warpage small" in the case where the warpage amount of the front surface of the metal circuit board 15 of the metal-ceramic bonded substrate 2 was within 2 μm/mm, "warpage large" in the case where the warpage amount exceeded 2 μm/mm, and "breakage" in the case where breakage occurred in the ceramic substrate. Broken lines in the graph indicate the upper limit and the lower limit in Expression (1). As illustrated in FIG. 8, the warpage amount was within 2 μm/mm when Expression (1) was satisfied, and the warpage amount was large when the R dimension was larger than the range of Expression (1) and breakage occurred in the ceramic substrate when the R dimension was smaller than the range of Expression (1).

INDUSTRIAL APPLICABILITY

The present invention is applied to a metal-ceramic bonded substrate and, in particular, to a radiator-integrated substrate in which a metal circuit board and a metal base plate each made of aluminum or an aluminum alloy are bonded to both surfaces of a ceramic substrate respectively and a radiator is bonded to a surface of the metal base plate where the ceramic substrate is not bonded, and to a manufacturing method of the same.

EXPLANATION OF CODES 1 radiator-integrated substrate
2 metal-ceramic bonded substrate
10 ceramic substrate
15 metal circuit board
20 metal base plate
30 radiator
31 gap part
33 brazing material layer
35 partition plate
38 flow path
40 lid member
41 lid part
45a, 45b liquid circulation port
51 radiator side jig
52 metal-ceramic bonded substrate side jig
55 concave R surface
56 convex R surface

What is claimed:

1. A manufacturing method of a radiator-integrated substrate comprising one surface of a metal circuit board made of aluminum or an aluminum alloy that is bonded to one surface of a ceramic substrate, and a metal base plate, wherein one surface of the metal base plate made of aluminum or an aluminum alloy is bonded to another surface of the ceramic substrate, and another surface of the metal base plate is bonded to a radiator, the method comprising:
   bonding the metal circuit board and the metal base plate to the ceramic substrate to form a metal-ceramic bonded substrate;
   then arranging the metal base plate of the metal-ceramic bonded substrate on one surface of the radiator via a brazing material with the metal base plate overlapping with the one surface of the radiator;
   arranging a jig having a concave R surface on another surface of the radiator with the jig butting against the another surface of the radiator;
   bringing a jig having a convex R surface protruding toward the metal-ceramic bonded substrate into contact with another surface of the metal circuit board of the metal-ceramic bonded substrate; and
   heat-bonding the metal-ceramic bonded substrate and the radiator while pressurizing the metal-ceramic bonded substrate and the radiator by the jig arranged on the radiator side and the jig arranged on the metal-ceramic bonded substrate side,
   wherein a curvature radius R (mm) of the convex R surface and the concave R surface is $$6500 \leq R \leq \text{surface pressure}(N/mm^2) \times 2000 + 12000.$$

2. The manufacturing method of a radiator-integrated substrate according to claim 1,
   wherein the ceramic substrate is rectangular, and a long side thereof is 40 mm or more.

3. The manufacturing method of a radiator-integrated substrate according to claim 1,
   wherein the surface pressure applied to the metal circuit board is 1.0 N/mm² or more.

4. The manufacturing method of a radiator-integrated substrate according to claim 1,
   wherein the surface pressure applied to the metal circuit board is 5.0 N/mm² or less.

5. The manufacturing method of a radiator-integrated substrate according to claim 1,
   wherein a thickness t1 of the metal circuit board and a thickness t2 of the metal base plate satisfy $t2/t1 \leq 2$, and t1 is 0.4 to 3 mm and t2 is 0.8 to 6 mm.

6. The manufacturing method of a radiator-integrated substrate according to claim 1,
   wherein the radiator is an extrusion member made of aluminum or an aluminum alloy.

7. The manufacturing method of a radiator-integrated substrate according to claim 1, wherein bonding of the ceramic substrate and the metal circuit board and bonding of the ceramic substrate and the metal base plate are performed by a molten metal bonding method.

8. A radiator-integrated substrate manufactured by the manufacturing method according to claim 1.

9. The radiator-integrated substrate according to claim 8, wherein a warpage amount of a front surface of the metal circuit board of the metal-ceramic bonded substrate after the metal-ceramic bonded substrate and the radiator are braze-bonded together is 2 μm/mm or less.

10. A radiator-integrated substrate comprising one surface of a metal circuit board made of aluminum or an aluminum alloy that is bonded to one surface of a ceramic substrate, and a metal base plate, wherein one surface of the metal base plate made of aluminum or an aluminum alloy is bonded to another surface of the ceramic substrate, and another surface of the metal base plate is bonded to a radiator via a brazing material,
wherein the ceramic substrate is rectangular and a long side thereof is 40 mm or more, and a warpage amount of a front surface of the metal circuit board of the metal-ceramic bonded substrate is 2 μm/mm or less.

* * * * *